United States Patent
Kang

(10) Patent No.: US 10,204,975 B2
(45) Date of Patent: Feb. 12, 2019

(54) ORGANIC LIGHT-EMITTING DIODE DISPLAY

(71) Applicant: Samsung Display Co., Ltd., Yongin-si, Gyeonggi-do (KR)

(72) Inventor: Seong Yeun Kang, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 116 days.

(21) Appl. No.: 15/244,888

(22) Filed: Aug. 23, 2016

(65) Prior Publication Data
US 2017/0062544 A1    Mar. 2, 2017

(30) Foreign Application Priority Data
Aug. 24, 2015  (KR) .................. 10-2015-0119126

(51) Int. Cl.
*H01L 27/32*      (2006.01)
*G09G 3/3275*     (2016.01)
*G09G 3/3225*     (2016.01)

(52) U.S. Cl.
CPC ....... *H01L 27/3276* (2013.01); *G09G 3/3225* (2013.01); *H01L 27/3223* (2013.01); *G09G 2300/0413* (2013.01); *G09G 2300/0809* (2013.01); *G09G 2300/0819* (2013.01); *G09G 2310/0262* (2013.01); *G09G 2320/045* (2013.01); *G09G 2330/08* (2013.01); *G09G 2330/10* (2013.01); *H01L 2251/568* (2013.01)

(58) Field of Classification Search
CPC ............. H01L 27/3276; H01L 27/3223; H01L 27/3225; H01L 27/326; G09G 3/3275; G09G 3/3225
See application file for complete search history.

(56) References Cited

U.S. PATENT DOCUMENTS

| | | | | |
|---|---|---|---|---|
| 9,830,852 | B2 * | 11/2017 | Kim | G09G 3/3225 |
| 2014/0346475 | A1 * | 11/2014 | Cho | H01L 27/326 257/40 |
| 2014/0347401 | A1 * | 11/2014 | Hwang | G09G 3/3233 345/690 |
| 2015/0022513 | A1 * | 1/2015 | Kim | G09G 3/3225 345/212 |
| 2015/0138171 | A1 * | 5/2015 | Kim | H01L 27/3223 345/205 |

FOREIGN PATENT DOCUMENTS

| | | |
|---|---|---|
| KR | 10-2008-0012148 A | 2/2008 |
| KR | 10-2010-0077434 A | 7/2010 |
| KR | 10-2014-0061140 A | 5/2014 |
| KR | 10-2015-0009882 A | 1/2015 |

* cited by examiner

*Primary Examiner* — Sardis F Azongha

(57) ABSTRACT

An organic light-emitting diode display is disclosed. In one aspect, the display includes a plurality of light emitting pixels disposed in a display region and including a first light emitting pixel and a second light emitting pixel, and a plurality of dummy pixels disposed in a dummy region and including a first dummy pixel and a second dummy pixel. The display also includes a plurality of repair lines including i) a first repair line configured to connect the first dummy pixel and the first and second light emitting pixels and ii) a second repair line configured to connect the second dummy pixel and the first and second light emitting pixels. A connection line is configured to connect the first and second repair lines, the first and second dummy pixel having layouts that are symmetrical.

20 Claims, 10 Drawing Sheets

ORGANIC LIGHT-EMITTING DIODE DISPLAY

CROSS-REFERENCE TO RELATED APPLICATION

This application claims priority to and the benefit of Korean Patent Application No. 10-2015-0119126 filed in the Korean Intellectual Property Office on Aug. 24, 2015, the entire contents of which are incorporated herein by reference.

BACKGROUND

Field

The described technology is generally related to an organic light-emitting diode (OLED) display.

Description of the Related Technology

An OLED display requires no separate light source and thus, it has a desirable characteristics including power consumption fast response rate, a wide viewing angle, and high contrast.

The OLED display includes a matrix of light-emitting pixel circuits including a red pixel, a blue pixel, a green pixel, a white pixel, and the like, and can display full colors by using combinations thereof. Each pixel circuit includes an OLED and thin film transistors for driving the OLED.

The OLED includes a pixel electrode, a common electrode, and an interposed light emitting layer. One of the pixel electrode and the common electrode serves as an anode and the other serves as a cathode. Electrons that are injected from the cathode and holes that are injected from the anode are recombined in the light emitting layer to form excitons, and light is emitted by releasing energy of the excitons. The common electrode is disposed over pixels and can transfer a constant common voltage.

Since a pixel circuit of the OLED display can be complex and process of manufacturing can be difficult, defective pixels can result in the final product. Therefore, a repair process that can reuse the defective pixel as a normal pixel is required to increase product yield.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can repair a defective pixel to be a normal pixel.

Another aspect is an OLED display including: a plurality of light emitting pixels disposed in a display region and including a first light emitting pixel and a second light emitting pixel; a plurality of dummy pixels disposed in a dummy region and including a first dummy pixel and a second dummy pixel; a plurality of repair lines configured to include a first repair line for connecting the first dummy pixel to the first light emitting pixel and the second light emitting pixel, and a second repair line for connecting the second dummy pixel to the first light emitting pixel and the second light emitting pixel; and a connection line configured to connect the first repair line and the second repair line, wherein the first dummy pixel and the second dummy pixel are configured to be symmetrical to each other.

The first light emitting pixel and the second light emitting pixel can be configured to be symmetrical to each other.

A light emitting pixel of the plurality of light emitting pixels can include an OLED and a light emitting pixel circuit connected to the OLED, and the dummy pixel can include a dummy pixel circuit.

The first dummy pixel can be configured to have a same configuration as one of a light emitting pixel circuit of the first light emitting pixel and a light emitting pixel circuit of the second light emitting pixel.

The light emitting pixel circuit can include a switching transistor connected to a scan line transferring a scan signal and a data line transferring a data voltage and crossing the scan line, and a driving transistor connected to the switching transistor.

The dummy pixel circuit can include a switching transistor connected to the scan line and a dummy data line, and a driving transistor connected to the switching transistor.

The dummy pixel can not include any OLED.

The OLED can include a pixel electrode electrically connected to the driving transistor of the light emitting pixel circuit, an organic light emitting layer disposed on the pixel electrode, and a common electrode disposed on the organic light emitting layer.

The dummy region can be disposed on at least one of left and right sides of the display region.

The first dummy pixel and the second dummy pixel can be formed alternately on each row.

The first light emitting pixel and the second light emitting pixel can be formed alternately on each column.

The dummy region can be disposed on at least one of upper and lower sides of the display region.

The first dummy pixel and the second dummy pixel can be formed alternately on each column.

The first light emitting pixel and the second light emitting pixel can be formed alternately on each column.

Another aspect is an organic light-emitting diode (OLED) display comprising: a plurality of light emitting pixels disposed in a display region and including a first light emitting pixel and a second light emitting pixel; a plurality of dummy pixels disposed in a dummy region and including a first dummy pixel and a second dummy pixel; a plurality of repair lines including i) a first repair line configured to connect the first dummy pixel and the first and second light emitting pixels and ii) a second repair line configured to connect the second dummy pixel and the first and second light emitting pixels; and a connection line configured to connect the first and second repair lines, wherein the first and second dummy pixel have layouts that are symmetrical.

In the above OLED display, the first and second light emitting pixels are symmetrical about a data line.

In the above OLED display, each of the light emitting pixels comprises an OLED and a light emitting pixel circuit connected to the OLED, and each of the dummy pixel comprises a dummy pixel circuit.

In the above OLED display, the first dummy pixel has the same configuration as the light emitting pixel circuit of one of the first and second light emitting pixels.

In the above OLED display, the light emitting pixel circuit comprises i) a switching transistor connected to a scan line configured to provide a scan signal and the data line configured to provide a data voltage and crossing the scan line and ii) a driving transistor connected to the switching transistor.

In the above OLED display, the dummy pixel circuit comprises i) a switching transistor connected to the scan line and a dummy data line and ii) a driving transistor connected to the switching transistor.

In the above OLED display, the dummy pixel does not have an OLED.

In the above OLED display, the OLED comprises a pixel electrode electrically connected to the driving transistor of the light emitting pixel circuit, an organic light emitting layer disposed on the pixel electrode, and a common electrode disposed on the organic light emitting layer.

In the above OLED display, the dummy region is disposed on at least one of left and right sides of the display region.

In the above OLED display, the first and second dummy pixels are alternately formed in each row.

In the above OLED display, the first and second light emitting pixels are alternately formed in each column.

In the above OLED display, the dummy region is disposed on at least one of upper and lower sides of the display region.

In the above OLED display, the first and second dummy pixels are alternately formed in each column.

In the above OLED display, the first and second light emitting pixels are alternately formed in each column.

Another aspect is an organic light-emitting diode (OLED) display comprising: a plurality of light emitting pixels disposed in a display region and including a first light emitting pixel and a second light emitting pixel, wherein the first and second light emitting pixels are symmetrical with respect to a data line therebetween, and wherein each of the light emitting pixels includes an OLED; a plurality of dummy pixels disposed in a dummy region and including a first dummy pixel and a second dummy pixel, wherein the first and second dummy pixel are symmetrical with respect to a virtual line therebetween, wherein the first dummy pixel is configured to drive the OLED of the first light emitting pixel when the first light emitting pixel becomes defective, and wherein the second dummy pixel is configured to drive the OLED of the second light emitting pixel when the second light emitting pixel becomes defective.

The OLED display further comprises: a plurality of repair lines including i) a first repair line configured to connect the first dummy pixel and the first and second light emitting pixels and ii) a second repair line configured to connect the second dummy pixel and the first and second light emitting pixels; and a connection line configured to connect the first and second repair lines.

In the above OLED display, the first and second dummy pixels are located in two adjacent rows and configured to drive the OLED of any defective light emitting pixel in the two adjacent rows via the connection line.

The above OLED display further comprises: a dummy data driver configured to drive the dummy pixels; a data driver configured to drive the light emitting pixels and transmit a data signal to the dummy data driver; a controller configured to control the dummy data driver and the data driver.

Another aspect is an organic light-emitting diode (OLED) display comprising: a display panel including a display region and a dummy region that do not overlap each other, wherein the display panel comprises: a plurality of light emitting pixels disposed in the display region and including a first light emitting pixel and a second light emitting pixel; a plurality of dummy pixels disposed in the dummy region and including a first dummy pixel and a second dummy pixel; a plurality of repair lines including i) a first repair line configured to connect the first dummy pixel and the first and second light emitting pixels and ii) a second repair line configured to connect the second dummy pixel and the first and second light emitting pixels; and a connection line configured to connect the first and second repair lines, wherein the first and second dummy pixel are symmetrical with respect to a virtual line therebetween; a dummy data driver configured to drive the dummy pixels; a data driver configured to drive the light emitting pixels and transmit a data signal to the dummy data driver; a controller configured to control the dummy data driver and the data driver.

In the above OLED display, each of the light emitting pixels includes an OLED, wherein the first and second dummy pixels are located in two adjacent rows and configured to drive the OLED of any defective light emitting pixel in the two adjacent rows via the connection line.

According to at least one of the disclosed embodiments, the defective pixel can be repaired to be the normal pixel.

DETAILED DESCRIPTION OF CERTAIN INVENTIVE EMBODIMENTS

Figure 1:
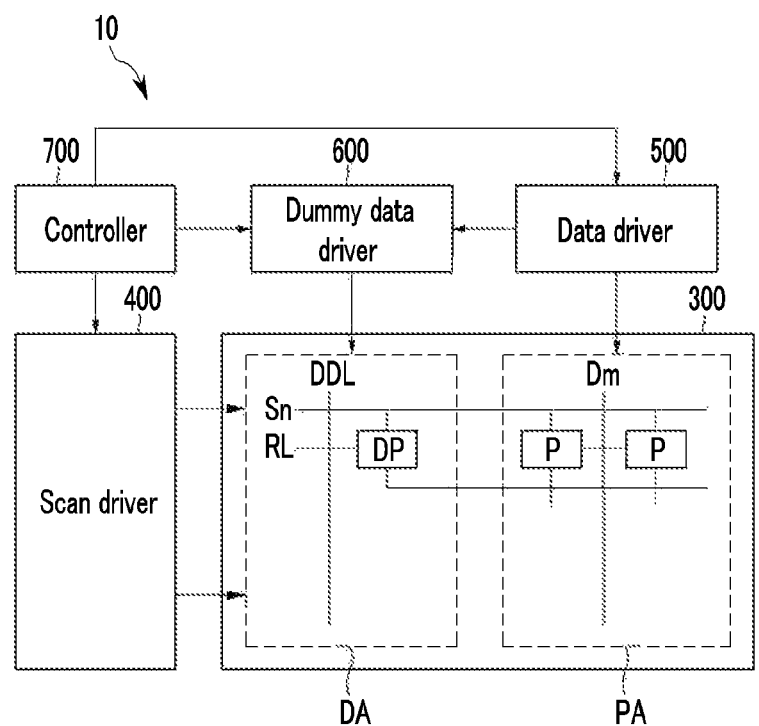
FIG. 1 is a schematic block diagram illustrating an OLED display according to an exemplary embodiment.

The described technology will be described fully hereinafter with reference to the accompanying drawings, in which exemplary embodiments of the described technology are shown. As those skilled in the art would realize, the described embodiments can be modified in various different ways, all without departing from the spirit or scope of the described technology.

For clear description, parts unrelated to the described technology will be omitted and like reference numerals designate like elements throughout the specification.

Further, a size and a thickness of each element in the drawings are arbitrarily displayed for the ease of creating the specification, so the described technology is not limited thereto.

In the drawings, the thicknesses of layers, films, panels, regions, etc., are exaggerated for clarity. Further, in the drawings, the thicknesses of parts of layers and regions are exaggerated for the ease of creating the specification. It will be understood that when an element such as a layer, film, region, or substrate is referred to as being "on" another element, it can be directly on the other element or intervening elements can also be present.

Further, terms including ordinal numbers such as first, second, and the like can be used to describe various constituent elements, however the constituent elements are not limited by the terms. The terms are used only to distinguish one constituent element from other elements.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, but does not essentially mean positioning on the upper side of the object portion based on a gravity direction. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Hereinafter, an OLED display 10 according to an exemplary embodiment will be described in detail with reference to FIG. 1 to FIG. 8.

Figure 2:
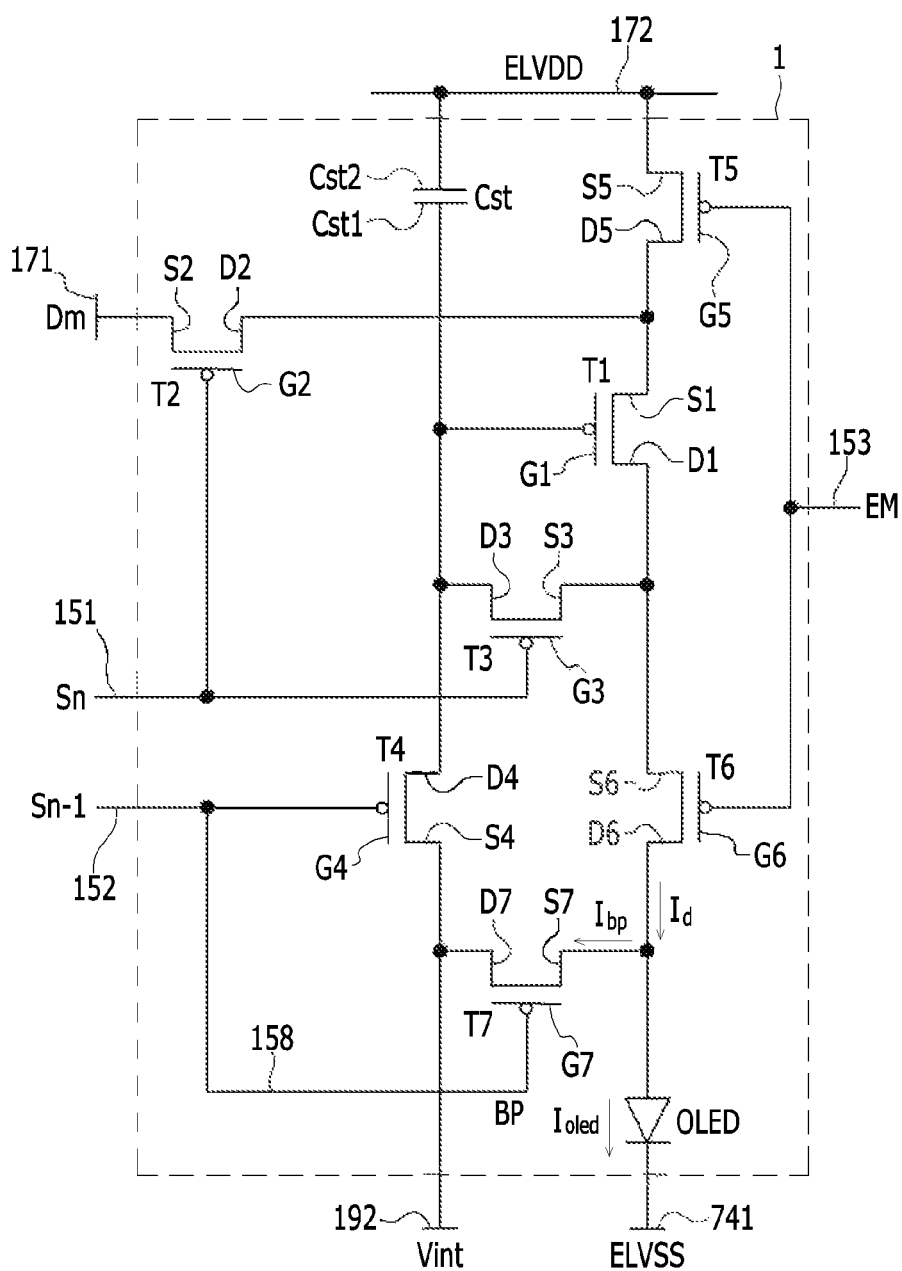
FIG. 2 is an equivalent circuit diagram illustrating one pixel of FIG. 1.

FIG. 1 is a schematic block diagram of the OLED display 10 according to an exemplary embodiment. Depending on embodiments, certain elements may be removed from or additional elements may be added to the OLED display 10 illustrated in FIG. 1. Furthermore, two or more elements may be combined into a single element, or a single element may be realized as multiple elements. This also applies to the remaining disclosed embodiments. FIG. 2 is an equivalent circuit diagram illustrating one pixel of FIG. 1.

Referring to FIG. 1, the OLED display according to an exemplary embodiment includes a display panel 300, a scan driver 400, a data driver 500, a dummy data driver 600, and a controller 700.

A display region PA and a dummy region DA positioned around the display area PA can be formed on the display panel 300.

The display region PA is connected to a scan line Sn and a data line Dm, and includes a plurality of light emitting pixels P arranged substantially in a matrix form. The dummy region DA includes the scan line Sn and a plurality of dummy pixels DP connected to a dummy data line DDL. The display panel 300 can include a repair line RL extending parallel to the scan line SL. The repair line RL can be disposed on each row, but the present exemplary embodiment is not limited thereto.

The scan driver 400 can be configured to generate a scan signal, and can sequentially supply the scan signal to the light emitting pixel P through a plurality of scan lines Sn.

The data driver 500 can sequentially provide a data signal to the light emitting pixel P through a plurality of data lines Dm. The data driver 500 converts an input image data DATA having a gray that is inputted from the controller 700, into the data signal in a form of a voltage or a current.

The dummy data driver 600 can be configured to generate the data signal, and can provide the data signal to the dummy pixel DP through the dummy data line DDL. In the case that the light emitting pixel P and the dummy pixel DP are connected to the repair line RL in the same row, when an identical scan signal is applied to the light emitting pixel P and the dummy pixel DP, the dummy data driver 600 applies the data signal that is identical with the data signal applied to the light emitting pixel P, to the dummy pixel DP.

The dummy data driver 600 is formed on an external flexible printed circuit board (PCB), and can apply the data signal by using an outer lead bonding (OLB) pad for a chip on film (COF) that is connected to dummy data lines DDL. The dummy data driver 600 can receive the data signal applied to the dummy pixel DP from the data driver 500.

The controller 700 is configured to generate a scan control signal and a data control signal, and transfers them to the scan driver 400 and the data driver 500, respectively. Accordingly, the scan driver 400 sequentially applies the scan signal to the scan lines Sn, and the data driver 500 applies a data signal to each pixel P. Further, the controller 700 is configured to generate a dummy data control signal that controls a time for applying a dummy data signal, and transfers the dummy data control signal to the dummy data driver 600. Accordingly, the dummy data driver 600 can supply a data signal that is identical to the data signal applied to the repaired light emitting pixel P through the dummy data line DDL connected to the dummy pixel DP, which is used in a repair. Further, a first power supply voltage ELVDD, a second power supply voltage ELVSS, a light emitting control signal EM, an initialization voltage $V_{int}$, and the like can be applied to each pixel P under control of the controller 700.

The scan driver 400, the data driver 500, the dummy data driver 600, and the controller 700 can be directly mounted on the display panel 300 in a form of at least one IC chip, can be mounted on a flexible printed circuit film (not shown) to be attached to the display panel in a form of a tape carrier package (TCP), or can be mounted on the separated printed circuit board (PCB) (not shown).

Further, the scan driver 400, the data driver 500, the dummy data driver 600, and the controller 700 can be integrated as a single chip. In this case, at least one of these elements or at least one circuit element including one of these elements can be externally mounted to the single chip.

Referring to FIG. 2, one light emitting pixel P of the OLED display according to an exemplary embodiment of the described technology includes a plurality of signal lines 151, 152, 153, 158, 171, 172, and 192, a plurality of transistors T1, T2, T3, T4, T5, T6, and T7 that are connected to the signal lines, a storage capacitor $C_{st}$, and an OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 for transferring a scan signal $S_n$, a previous scan line 152 for transferring a previous scan signal $S_{n-1}$ to the initialization transistor T4, a light emitting control line 153 for transferring the light emitting control signal EM to the operation control transistor T5 and the light emission control transistor T6, a bypass control line 158 for transferring a bypass signal BP to the bypass transistor T7, a data line 171 that crosses the scan line 151 and transfers a data signal $D_m$, a driving voltage line 172 that is substantially parallel to the data line 171 and transfers a driving voltage ELVDD, and a initialization voltage line 192 for transferring the initialization voltage $V_{int}$ that initializes the driving transistor T1.

The driving transistor T1 is electrically connected at a gate electrode G1 thereof to a first end $C_{st}1$ of the storage capacitor $C_{st}$ is electrically connected at a source electrode S1 thereof to the driving voltage line 172 via the operation control transistor T5, and is electrically connected at a drain electrode D1 thereof to an anode of the OLED via the light emission control transistor T6. The driving transistor T1 receives the data signal $D_m$ depending on a switching operation of the switching transistor T2, and supplies a driving current $I_d$ to the OLED.

The switching transistor T2 is connected at a gate electrode G2 thereof to the scan line 151, is connected at a source electrode S2 thereof to the data line 171, and is connected at a drain electrode D2 thereof to the source electrode S1 of the driving transistor T1 and also to the driving voltage line 172 via the operation control transistor T5. This switching transistor T2 is turned on depending on the scan signal $S_n$, which is received through the scan line 151, to perform the switching operation that transfers the data signal $D_m$, which is transferred through the data line 171, to the source electrode S1 of the driving transistor T1.

The compensation transistor T3 is connected at a gate electrode G3 thereof to the scan line 151, and is connected at a source electrode S3 thereof to the drain electrode D1 of the driving transistor T1 and also to the anode of the OLED via the light emission control transistor T6, and a drain electrode D3 of the compensation transistor T3 is connected together to a drain electrode D4 of the initialization transistor T4, the first end $C_{st}1$ of the storage capacitor $C_{st}$, and the gate electrode G1 of the driving transistor T1. This compensation transistor T3 is turned on depending on the scan signal $S_n$, which is transferred through the scan line 151, to diode-connect the driving transistor T1 by mutually connecting the gate and drain electrodes G1 and D1 of the driving transistor T1.

The initialization transistor T4 is connected at a gate electrode G4 thereof to the previous scan line 152, and is connected at a source electrode S4 thereof to the initialization voltage line 192, and the drain electrode D4 of the initialization transistor T4 is connected together to the first end $C_{st}1$ of the storage capacitor $C_{st}$ and the gate electrode G1 of the driving transistor T1 through the drain electrode D3 of the compensation transistor T3. This initialization transistor T4 is turned on depending on the previous scan signal $S_{n-1}$, which is transferred through the previous scan line 152, to perform an initialization operation that initializes a gate voltage of the gate electrode G1 of the driving transistor T1 by transferring the initialization voltage $V_{int}$ to the gate electrode G1 of the driving transistor T1.

The operation control transistor T5 is connected at a gate electrode G5 thereof to the light emitting control line 153, is connected at a source electrode S5 thereof to the driving voltage line 172, and is connected at a drain electrode D5 thereof to the source electrode S1 of the driving transistor T1 and a drain electrode S2 of the switching transistor T2.

The light emission control transistor T6 is electrically connected at a gate electrode G6 thereof to the light emitting control line 153, is electrically connected at a source electrode S6 thereof to the drain electrode D1 of the driving transistor T1 and the source electrode S3 of the compensation transistor T3, and is electrically connected at a drain electrode D6 thereof to the anode of the OLED. The operation control transistor T5 and the light emission control transistor T6 are simultaneously turned on depending on the light emitting control signal EM, which is transferred through the light emitting control line 153, and thus the driving voltage ELVDD is compensated through the diode-connected driving transistor T1 to be transferred to the OLED.

The storage capacitor $C_{st}$ is connected at a second end $C_{st}2$ thereof to the driving voltage line 172, and a cathode of the OLED is connected to a common voltage line 741 transferring a common voltage ELVSS.

Meanwhile, a configuration of 7 transistors and 1 capacitor, including the bypass transistor T7, is illustrated in an exemplary embodiment of the described technology, but the described technology is not limited thereto, and the numbers of transistors and capacitors can be variously adjusted.

Hereinafter, a detailed operation process of one pixel of an OLED display according to an exemplary embodiment of the described technology will be described with reference to FIG. 3.

Figure 3:
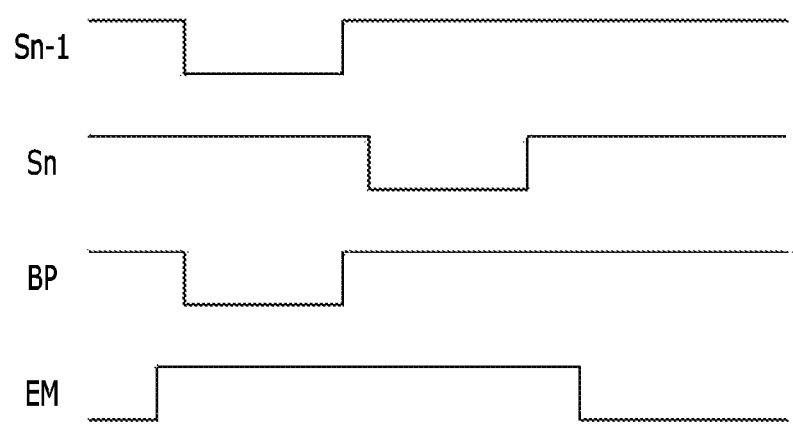
FIG. 3 is a timing diagram illustrating a signal applied to one pixel of an OLED display according to an exemplary embodiment.

FIG. 3 is a timing diagram illustrating a signal applied to one pixel of the OLED display according to the exemplary embodiment of the described technology.

As shown in FIG. 3, first, the previous scan signal $S_{n-1}$ having a low level is supplied through the previous scan line 152 during an initialization period. Then, the initialization transistor T4 is turned on to correspond to the previous scan signal $S_{n-1}$ having the low level, and the initialization voltage $V_{int}$ is transferred to the gate electrode G1 of the driving transistor T1 through the initialization voltage line 192 via the initialization transistor T4, so the driving transistor T1 is initialized by the initialization voltage $V_{int}$.

Thereafter, the scan signal $S_n$ having the low level is supplied through the scan line 151 during a data programming period. Then, the switching transistor T2 and the compensation transistor T3 are turned on corresponding to the scan signal $S_n$ at the low level. In this case, the driving transistor T1 is diode-connected by the compensation transistor T3, which is turned on, and is biased in a forward direction.

Then, a compensation voltage $D_m+V_{th}$ ($V_{th}$ is a negative value) that is obtained by subtracting a threshold voltage $V_{th}$ of the driving transistor T1 from the data signal $D_m$, which is supplied through the data line 171, is applied to the gate electrode G1 of the driving transistor T1. The driving voltage ELVDD and the compensation voltage $D_m+V_{th}$ are applied to opposite ends of the storage capacitor $C_{st}$, and a charge corresponding to a difference between voltages of the opposite ends thereof is stored in the storage capacitor $C_{st}$.

Thereafter, the light emitting control signal EM supplied through the light emitting control line 153 during a light emitting period is changed from a high level to the low level. The operation control transistor T5 and the light emission control transistor T6 are then turned on by the light emitting control signal EM having the low level during the light emitting period.

Then, the driving current $I_d$ is generated depending on a voltage difference between the gate voltage of the gate electrode G1 of the driving transistor T1 and the driving voltage ELVDD, and the driving current $I_d$ is supplied to the OLED through the light emission control transistor T6. A gate-source voltage $V_{gs}$ of the driving transistor T1 is maintained at "$(D_m+V_{th})$-ELVDD" by the storage capacitor $C_{st}$ during the light emitting period, and the driving current $I_d$ is proportional to a square of a value that is obtained by subtracting the threshold voltage from a source-gate voltage, that is, "$(D_m-ELVDD)^2$", according to a current-voltage relationship of the driving transistor T1. Accordingly, the driving current $I_d$ is determined regardless of the threshold voltage $V_{th}$ of the driving transistor T1.

In this case, the bypass transistor T7 receives the bypass signal BP through the bypass control line 158. The bypass signal BP serves as a voltage of a predetermined level that is always able to turn off the bypass transistor T7, the bypass transistor T7 is always turned off by receiving the voltage of a transistor-OFF level, and a part of the driving current $I_d$ that serves as a bypass current $I_{bp}$ is bypassed through the bypass transistor T7 in an OFF state.

Figure 5:
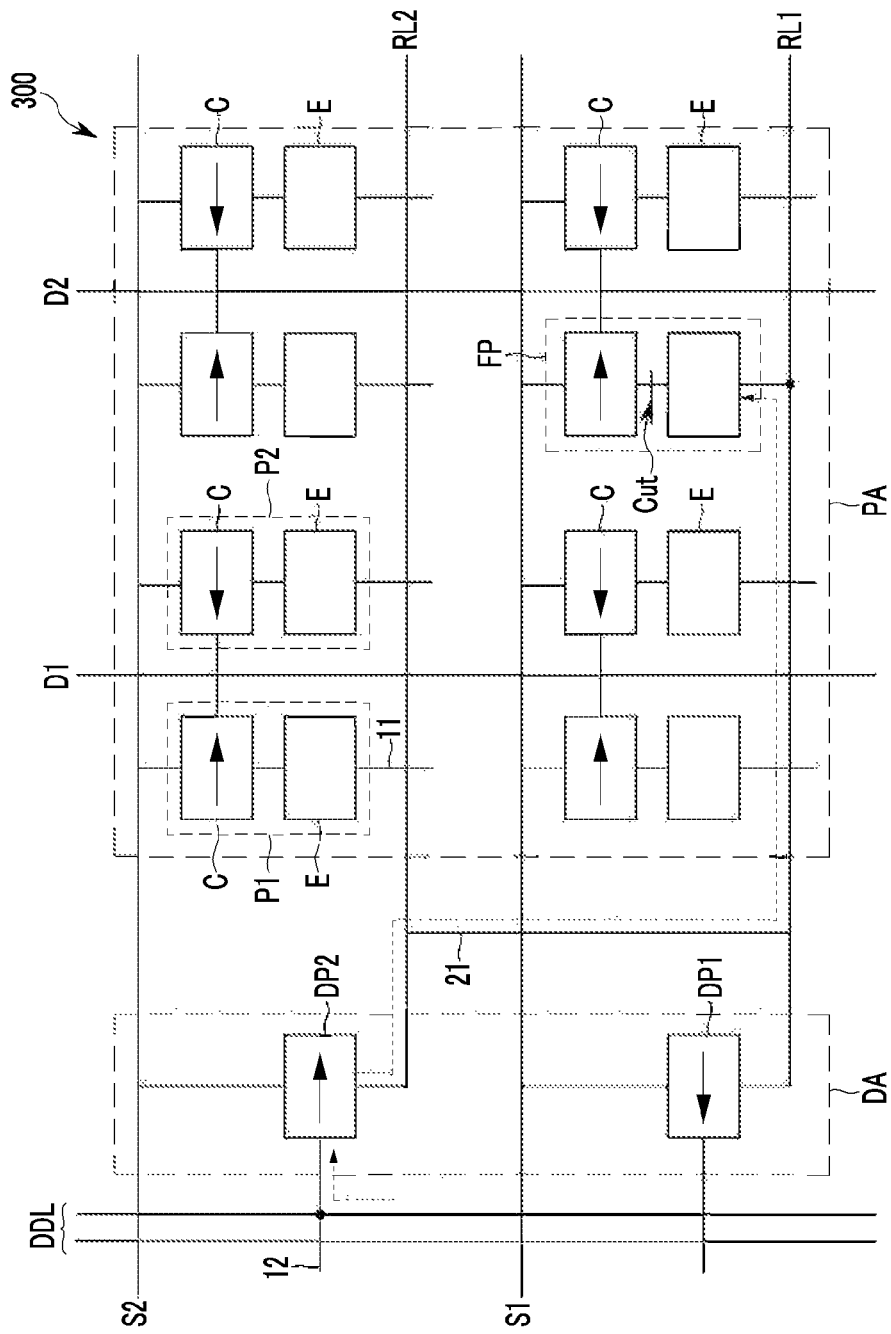
FIG. 5 and FIG. 6 illustrate a repair method for repairing a defective pixel by using a repair line in a display panel illustrated in FIG. 4.
Figure 6:
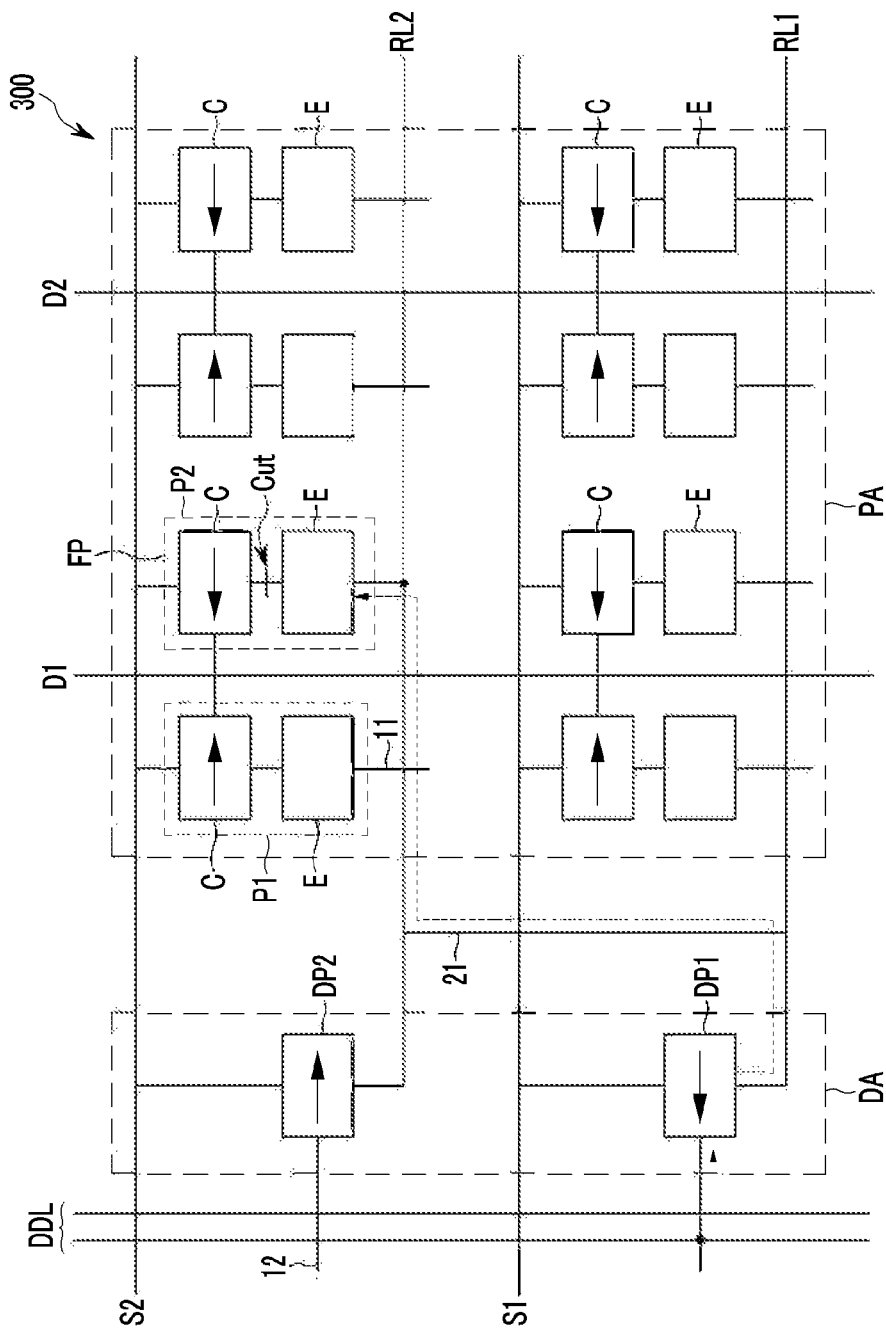

Hereinafter, the repair of a defective pixel of the OLED display that has an aforementioned configuration according to an exemplary embodiment of the described technology will be described with reference to FIG. 4 to FIG. 6.

Figure 4:
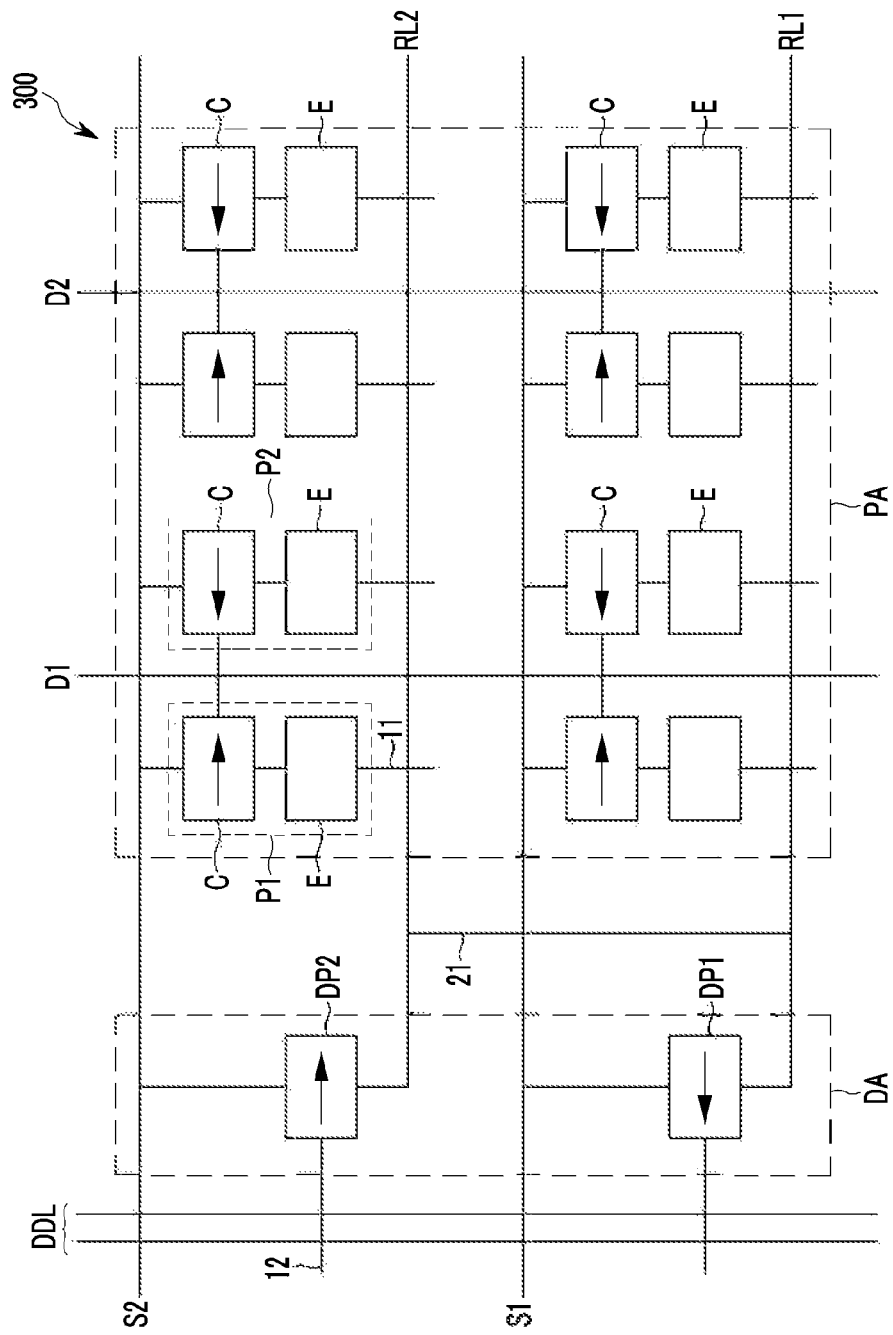
FIG. 4 is a schematic block diagram illustrating a display panel of an OLED display according to an exemplary embodiment.

FIG. 4 is a schematic block diagram illustrating the display panel of the OLED display according to the exemplary embodiment of the described technology. FIG. 5 and FIG. 6 illustrate a repair method for repairing the defective pixel by using the repair line in the display panel illustrated in FIG. 4.

First, referring to FIG. 4, the display panel 300 includes the display region PA that displays an image by emitting light, and the dummy region DA positioned around the display region PA.

In the display region PA, the scan lines S1 and S2 and the data lines D1 and D2 are arranged, and the light emitting pixels P that are connected to the scan lines S1 and S2 and the data lines D1 and D2 are formed. The light emitting pixels P can be arranged substantially in a matrix form.

One light emitting pixel P includes a light emitting pixel circuit C and an OLED E that emits light by receiving a driving current from the light emitting pixel circuit C. The light emitting pixel circuit C can include at least one of the thin film transistor and a capacitor. The light emitting pixel P emits light in one color, for example, among red, blue, green, and white. However, the described technology is not limited thereto, and the light emitting pixel P can emit light in other colors besides red, blue, green, and white.

A plurality of light emitting pixels P include a first light emitting pixel P1 and a second light emitting pixel P2.

The first light emitting pixel P1 and the second light emitting pixel P2 can be connected to one data line D1 or D2 and can be configured to have a horizontally symmetric shape. Symbols "→" and "←" represent that the first light emitting pixel P1 and the second light emitting pixel P2 are configured to have the horizontally symmetric shape. The shapes of the first light emitting pixel P1 and the second light emitting pixel P2 of the OLED display according to an exemplary embodiment of the described technology will be described later with reference to FIGS. 7 to 10.

In each row, the repair lines RL1 and RL2 that are parallel to the scan line S1 and S2 and spaced apart therefrom are arranged. OLEDs Es of the light emitting pixels P are insulated from the repair line RL. However, when the repair is performed, the OLEDs Es can be electrically connected to the repair line RL1 and RL2. For example, the OLEDs Es are electrically connected to a first connection line 11, and the first connection line 11 can be formed to partially overlap the repair line RL1 and RL2 with an insulating layer interposed therebetween. The first connection line 11 can include at least one conducting layer that is formed of a conductive material. When the repair is performed, a laser is irradiated onto an overlapping region of the first connection line 11 and the repair line RL, the insulating layer is destroyed, and the first connection line 11 and the repair line RL1 and RL2 are short-circuited, so that the first connection line 11 and the repair line RL1 and RL2 can become electrically connected to each other. Accordingly, the OLEDs Es of the light emitting pixels P can be electrically connected to the repair line RL.

The dummy region DA can be formed in at least one of left and right sides of the display region PA. However, the described technology is not limited thereto. For example, the dummy region DA is formed in at least one of upper and lower sides of the display region PA. FIG. 4 illustrates an example in which one dummy region DA is formed in the left side of the display region PA, and the dummy pixel DP is formed in each pixel row.

The dummy pixel DP connected to the scan lines SL is formed in the dummy region DA. The dummy data lines DDL are formed in the dummy region DA. The dummy data lines DDL are arranged in a column direction that is parallel to the data lines D1 and D2. The dummy pixel DP includes no OLED, but includes a dummy pixel circuit.

The dummy pixel DP includes a first dummy pixel DP1 and a second dummy pixel DP2 that are formed alternately on each row.

The first dummy pixel DP1 and the second dummy pixel DP2 are horizontally symmetric with respect to a virtual vertical line. That is, when the layout of the first dummy pixel DP1 has an identical configuration with the layout of the light emitting pixel circuit C of the first light emitting pixel P1, the layout of the second dummy pixel DP2 has an identical configuration with the layout of the light emitting pixel circuit C of the second light emitting pixel P2. When the layout of the first dummy pixel DP1 has the identical configuration with the layout of the light emitting pixel circuit C of the second light emitting pixel P2, the layout of the second dummy pixel DP2 has the identical configuration with the layout of the light emitting pixel circuit C of the first light emitting pixel P1.

The dummy pixel DP is insulated from the dummy data lines DDL. However, when the repair is performed, the dummy pixel DP can be electrically connected to one dummy data line DDL. For example, the dummy pixel DP is electrically connected to a second connection line 12, and the second connection line 12 is formed to partially overlap at least one dummy data line DDL with the insulating layer interposed therebetween. The second connection line 12, similar to the first connection line 11, can include at least one conducting layer that is formed of a conductive material. When the repair is performed, the laser is irradiated onto the overlapping region of the second connection line 12 and the dummy data line DDL, the insulating layer is destroyed, and the second connection line 12 and the dummy data line DDL are short-circuited, so that the second connection line 12 and the dummy data line DDL can become electrically connected to each other. Accordingly, one dummy pixel DP can be electrically connected to one dummy data line DDL.

Further, a first repair line RL1 and a second repair line RL2 are connected to each other through a third connection line 21.

Hereinafter, a method for repairing one of the light emitting pixels P disposed in the display region PA, which is defective, will be described with reference to FIG. 5 and FIG. 6.

First, the method for repairing the first light emitting pixel P1 that is defective will be described referring to FIG. 5.

The OLED E of a defective light emitting pixel FP is separated from the light emitting pixel circuit C. For example, the OLED E of the defective light emitting pixel FP is separated from the light emitting pixel circuit C by irradiating the laser onto a connecting region of the OLED E and the light emitting pixel circuit C to cut it off.

Subsequently, the OLED E of the defective light emitting pixel FP and the second dummy pixel DP2 are electrically connected to each other. Herein, the second dummy pixel DP2 has the identical configuration with the light emitting pixel circuit C of the defective light emitting pixel FP. For example, when the light emitting pixel circuit C of the defective light emitting pixel FP has a configuration indicated by a symbol "→", the dummy pixel DP that is connected to the defective light emitting pixel FP is the second dummy pixel DP2 that has a configuration indicated by a symbol "→". For example, when a semiconductor of the light emitting pixel circuit C is configured to have a Z-shape, the semiconductor of the second dummy pixel DP2 is also configured to have the Z-shape.

In this case, the first connection line 11 and the OLED E are electrically connected to the first repair line RL1 by irradiating the laser onto the overlapping region of the first repair line RL1 positioned at the same row as that of the first connection line 11 that is connected to the OLED E of the defective light emitting pixel FP. Then, the second connection line 12 and the dummy data line DDL are electrically connected by irradiating the laser onto the overlapping region of the second connection line 12 that is connected to the second dummy pixel DP2, and one dummy data line DDL.

Next, the method for repairing the second light emitting pixel P2 that is defective will be described with reference to FIG. 6.

The OLED E of a defective light emitting pixel FP is separated from the light emitting pixel circuit C. For example, the OLED E of the defective light emitting pixel FP is separated from the light emitting pixel circuit C by irradiating the laser onto the connecting region of the OLED E and the light emitting pixel circuit C to cut it off.

Subsequently, the OLED E of the defective light emitting pixel FP and the first dummy pixel DP1 are electrically connected to each other. Herein, the first dummy pixel DP1 has the identical configuration with the light emitting pixel circuit C of the defective light emitting pixel FP. For example, when the light emitting pixel circuit C of the defective light emitting pixel FP has a configuration indicated by "←", the dummy pixel DP that is connected to the defective light emitting pixel FP is the first dummy pixel DP1 that has a configuration indicated by "←". For example, when the semiconductor of the light emitting pixel circuit C is configured to have an inverse Z-shape, the semiconductor of the first dummy pixel DP1 is also configured to have the inverse Z-shape.

In this case, the first connection line 11 and the OLED E are electrically connected to the second repair line RL2 by irradiating the laser onto the overlapping region of the second repair line RL2 positioned at the same row as that of the first connection line 11 that is connected to the OLED E of the defective light emitting pixel FP. Then, the second connection line 12 and the dummy data line DDL are electrically connected by irradiating the laser onto the overlapping region of the second connection line 12 that is connected to the second dummy pixel DP2, and one dummy data line DDL.

That is, the OLED E of the defective light emitting pixel FP and the light emitting pixel circuit C are disconnected from each other, and the OLED E of the defective light emitting pixel FP and the dummy pixel DP are connected to each other. Further, the data signal that is supplied through the data line D1 and D2 is transferred to the dummy data line DDL. Then, the OLED E of the defective light emitting pixel FP can appropriately emit light by the current that is supplied from the dummy pixel DP.

In this case, the OLED E of the defective light emitting pixel FP is connected to the dummy pixel DP that has a same configuration as that of the light emitting pixel circuit C of the defective light emitting pixel FP.

In the case that the OLED E of the defective light emitting pixel FP is connected to the dummy pixel DP that is configured to have an opposite shape to the light emitting pixel circuit C of the defective light emitting pixel FP, the defective pixel is unable to be repaired to be a normal pixel.

For example, in the case that the OLED E of the defective light emitting pixel FP is connected to the dummy pixel DP that is configured to have the opposite shape to another light emitting pixel circuit C positioned at the same column, an inconsistency of a parasitic capacitance with another light emitting pixel P that is positioned at the same column occurs by an overlay distortion generated in a display panel manufacturing process. Accordingly, a different current from that of the other light emitting pixel circuit C that is positioned at the same column is generated in the OLED E of the defective light emitting pixel FP, so the defective pixel is unable to be repaired to be the normal pixel.

However, the OLED display according to an exemplary embodiment of the described technology can repair the defective pixel to be the normal pixel by connecting the OLED E of the defective light emitting pixel FP to the dummy pixel DP that has the same configuration as that of the light emitting pixel circuit C of the defective light emitting pixel FP.

Hereinafter, a detailed configuration of the OLED display that has the aforementioned configuration according to an exemplary embodiment of the described technology will be described with reference to FIG. 7 to FIG. 10.

Figure 7:
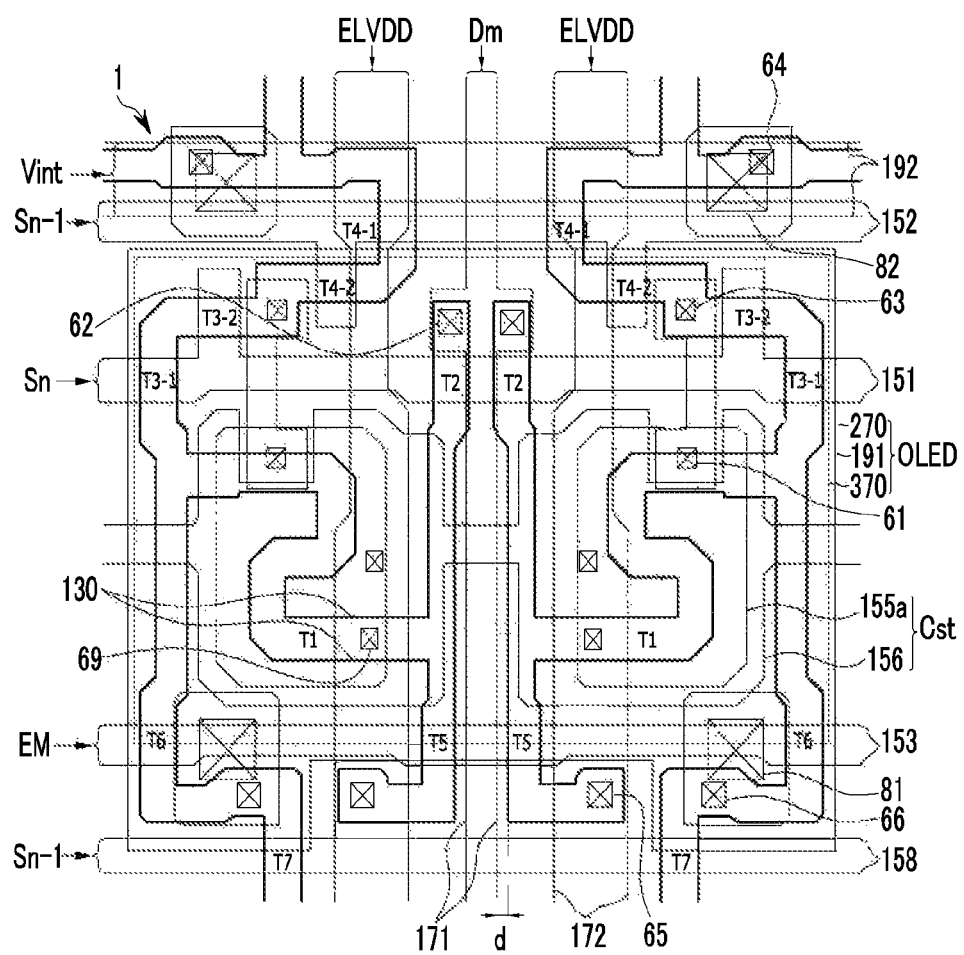
FIG. 7 schematically illustrates a plurality of transistors and capacitors of two adjacent pixels of an OLED display according to an exemplary embodiment.
Figure 8:
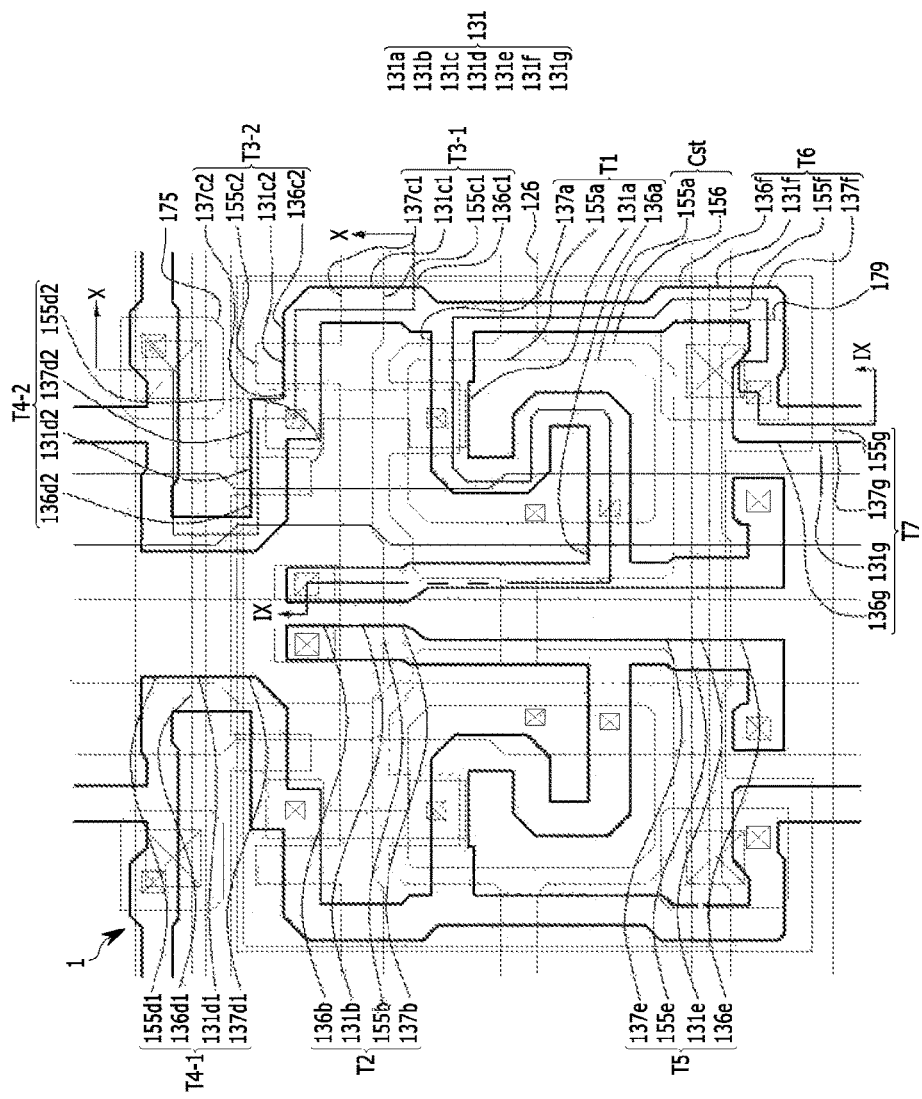
FIG. 8 is a layout view of two adjacent pixels of FIG. 7.
Figure 9:
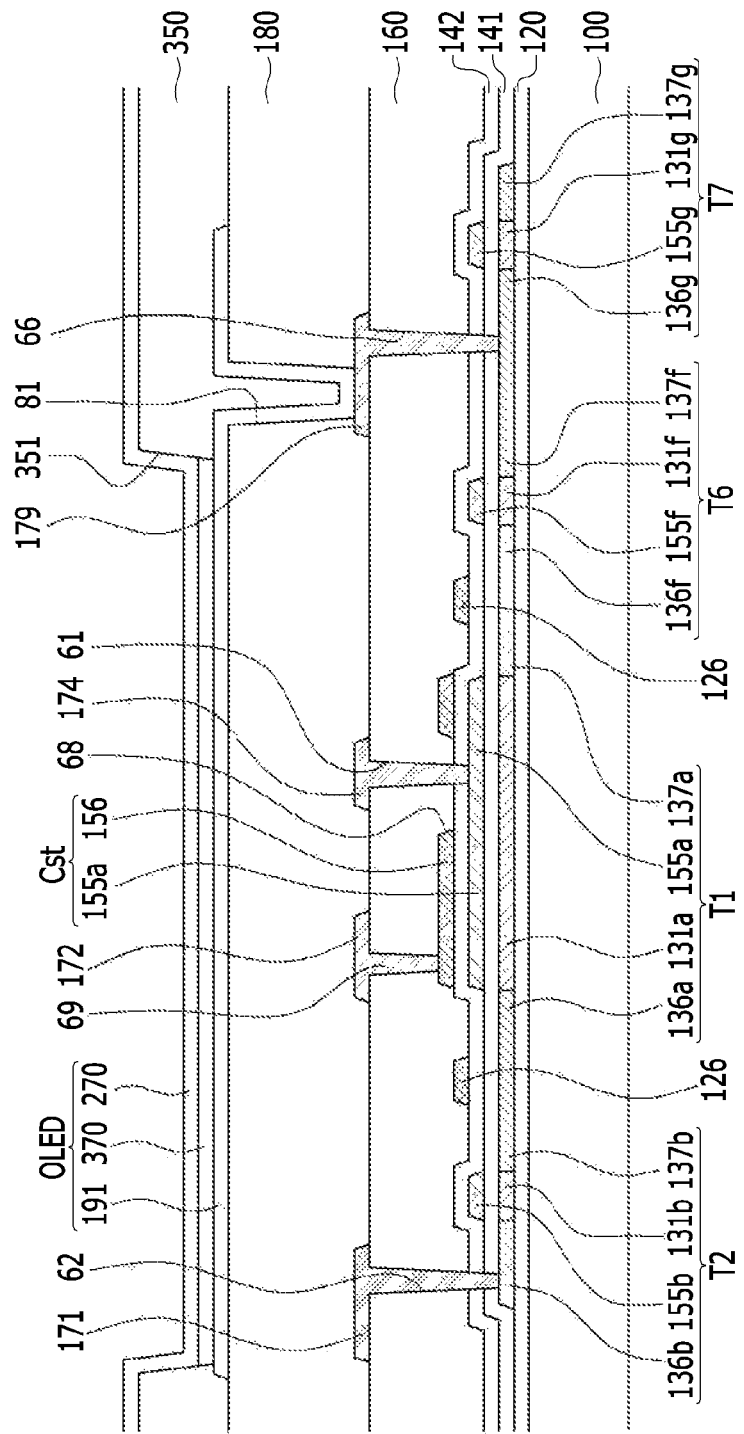
FIG. 9 is a cross-sectional view of the OLED display of FIG. 8 taken along the line IX-IX.
Figure 10:
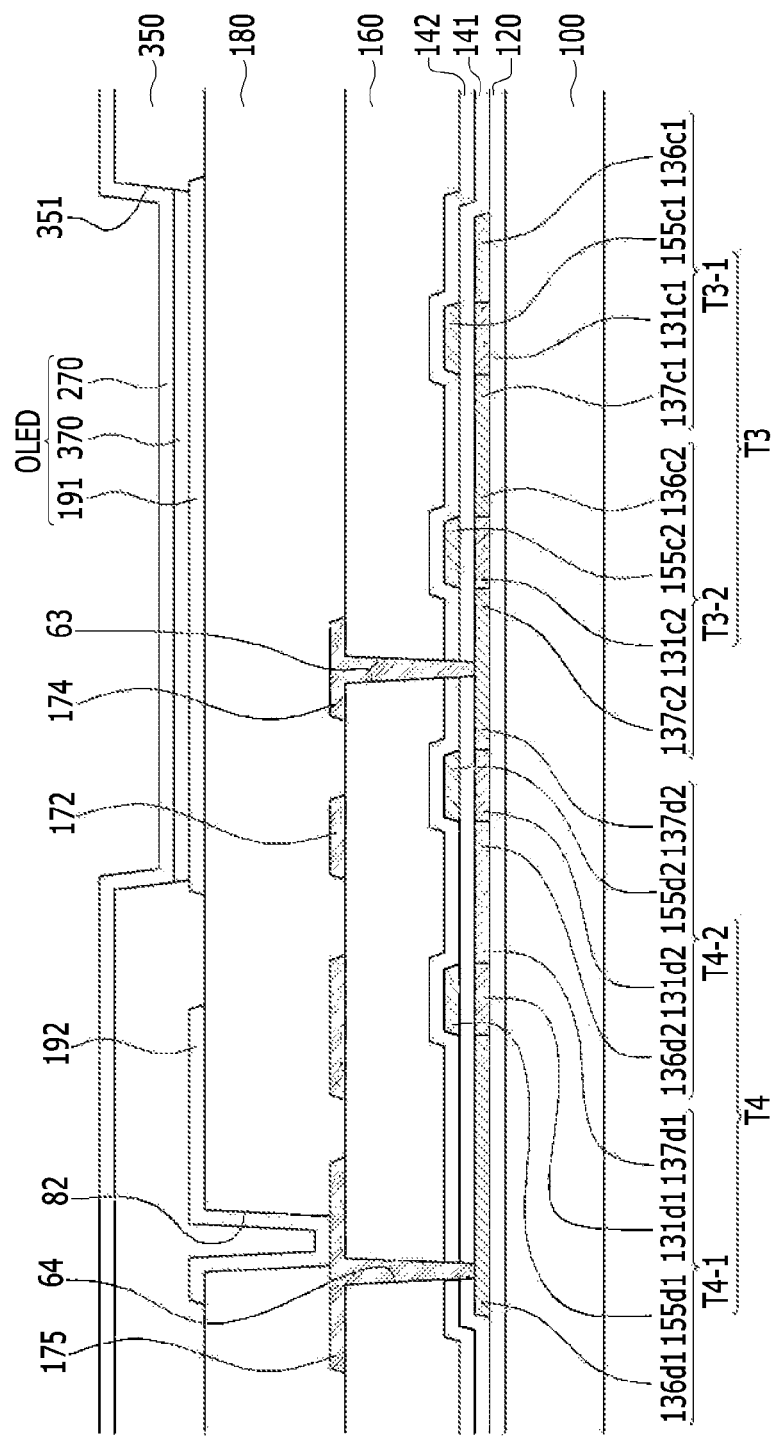
FIG. 10 is a cross-sectional view of the OLED display of FIG. 8 taken along the line X-X.

FIG. 7 illustrates a plurality of transistors and capacitors of two adjacent pixels of the OLED display according to an exemplary embodiment of the described technology. FIG. 8 is a layout view of two adjacent pixels of FIG. 7. FIG. 9 is a cross-sectional view of the OLED display of FIG. 8 taken along the line IX-IX. FIG. 10 is the cross-sectional view of the OLED display of FIG. 8 taken along the line X-X.

Hereinafter, referring to FIG. 7 and FIG. 8, a detailed in-plane configuration of the OLED display according to the exemplary embodiment of the described technology will be described first, and then a detailed cross-sectional configuration thereof will be described with reference to FIG. 9 and FIG. 10.

First, one pixel of the OLED display according to exemplary embodiment of the described technology will be described with reference to FIG. 7 and FIG. 8.

The OLED display according to the exemplary embodiment of the described technology includes the scan line 151, the previous scan line 152, the light emitting control line 153, and the bypass control line 158, which are formed along a row direction to apply the scan signal $S_n$, the previous scan signal $S_{n-1}$, the light emitting control signal EM, and the bypass signal BP, respectively. Further, the data line 171 and the driving voltage line 172 are included therein. In this case, the data line 171 and the driving voltage line 172 crosses the scan line 151, the previous scan line 152, the light emitting control line 153, and the bypass control line 158, and respectively apply the data signal $D_m$ and the driving voltage ELVDD to a pixel 1. The initialization voltage $V_{int}$ is transferred through the initialization voltage line 192 to the compensation transistor T3 via the initialization transistor T4.

Further, the driving transistor T1, the switching transistor T2, the compensation transistor T3, the initialization transistor T4, the operation control transistor T5, the light emission control transistor T6, the bypass transistor T7, the storage capacitor $C_{st}$, and the OLED are formed in the pixel 1. The OLED includes a pixel electrode 191, an organic light emitting layer 370, and a common electrode 270. Herein, the compensation transistor T3 and the initialization transistor T4 have a dual gate configuration for blocking a leakage current.

Each channel of the driving transistor T1, the switching transistor T2, the compensation transistor T3, the initialization transistor T4, the operation control transistor T5, the light emission control transistor T6, and the bypass transistor T7 is formed in an interior of one continuous semiconductor 130, and the semiconductor 130 can be formed to be curved in various shapes. This semiconductor 130 can be formed of a polycrystalline semiconductor material or an oxide semiconductor material. The oxide semiconductor material can include any one of oxides among titanium (Ti), hafnium (Hf), zirconium (Zr), aluminum (Al), tantalum (Ta), germanium (Ge), zinc (Zn), gallium (Ga), tin (Sn), or indium (In) as a base, or complex oxides thereof such as indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case that the semiconductor 130 is formed of the oxide semiconductor material, a separate protecting layer can be added to protect the oxide semiconductor material, which is vulnerable to an external environment such as a high temperature, and the like.

The semiconductor 130 includes the channel that is channel-doped with an N-type impurity or a P-type impurity, and a source doping region and a drain doping region that are formed on opposite sides of the channel and have a higher doping concentration than that of a doping impurity that is doped on the channel. In the present exemplary embodiment, the source doping region and the drain doping region respectively serve as a source electrode and a drain electrode. The source electrode and the drain electrode of the semiconductor 130 can be formed by doping only appropriate regions thereof. Further, in the semiconductor 130, regions formed between source electrodes and drain electrodes of different transistors can also be doped, so the source electrodes and the drain electrodes can be electrically connected to each other.

As shown in FIG. 8, a channel 131 includes a driving channel 131a that is positioned in the driving transistor T1, a switching channel 131b that is positioned in the switching transistor T2, a compensation channel 131c that is positioned in the compensation transistor T3, an initialization channel 131d that is positioned in the initialization transistor T4, an operation control channel 131e that is positioned in the operation control transistor T5, a light emitting control channel 131f that is positioned in the light emitting control transistor T6, and a bypass channel 131g that is positioned on the bypass transistor T7.

The driving transistor T1 includes the driving channel 131a, a driving gate electrode 155a, a driving source electrode 136a, and a driving drain electrode 137a. The driving channel 131a is curved and can have a meandering shape or a zigzag shape. In this way, by forming the driving channel 131a in such a curved shape, the driving channel 131a can be formed to be long in a narrow space. Accordingly, a driving range of the gate voltage $V_g$ that is applied to the driving gate electrode 155a is expanded by the action of the long-formed driving channel 131a. Since the driving range of the gate voltage $V_g$ is expanded, a gray of light emitted from the OLED can be more minutely controlled by adjusting a magnitude of the gate voltage $V_g$, and as a result, a resolution of the OLED display can be increased and display quality thereof can be improved. Various exemplary embodiments are possible by changing the driving channel 131a to various shapes such as an inverse S-shape, an S-shape, an M-shape, a W-shape, or the like.

The driving gate electrode 155a overlaps the driving channel 131a, and the driving source electrode 136a and the driving drain electrode 137a are formed adjacently at opposite sides of the driving channel 131a, respectively. The driving gate electrode 155a is connected to a first data connecting member 174 through a contact hole 61.

The driving source electrode 136a is spaced apart from the data line 171 with a predetermined interval "d" therebetween, so they are not overlapped with each other. Accordingly, the parasitic capacitance between the driving source electrode 136a and the data line 171 can be minimized. In this case, interference between the driving voltage ELVDD that is transferred to the driving source electrode 136a by the light emitting control signal EM, and the data signal $D_m$ that is transferred through the data line, can be minimized.

Meanwhile, the switching transistor T2 includes the switching channel 131b, a switching gate electrode 155b, a switching source electrode 136b, and a switching drain electrode 137b. The switching gate electrode 155b that is a portion of the scan line 151 expanded downward therefrom overlaps the switching channel 131b, and the switching source electrode 136b and the switching drain electrode 137b are formed adjacently at opposite sides of the switching channel 131b, respectively. The switching source electrode 136b is connected to the data line 171 through a contact hole 62.

Two compensation transistors T3 are formed to prevent the leakage current, and include a first compensation transistor T3-1 and a second compensation transistor T3-2 that are adjacent to each other. The first compensation transistor T3-1 is disposed based on the scan line 151, and the second compensation transistor T3-2 is disposed based on a protruding portion of the scan line 151. The first compensation transistor T3-1 includes a first compensation channel 131c1, a first compensation gate electrode 155c1, a first compensation source electrode 136c1, and a first compensation drain electrode 137c1, and the second compensation transistor T3-2 includes a second compensation channel 131c2, a second compensation gate electrode 155c2, a second compensation source electrode 136c2, and a second compensation drain electrode 137c2.

The first compensation gate electrode 155c1 that is a part of the scan line 151 overlaps the first compensation channel 131c1, and the first compensation source electrode 136c1 and the first compensation drain electrode 137c1 are formed adjacently at opposite sides of the first compensation channel 131c1, respectively. The first compensation source electrode 136c1 is connected to a light emitting control source electrode 136f and the driving drain electrode 137a, and the first compensation drain electrode 137c1 is connected to the second compensation source electrode 136c2.

The second compensation gate electrode 155c2 that is a protruding portion of the scan line 151 protruded upward therefrom overlaps the second compensation channel 131c2, and the second compensation source electrode 136c2 and the second compensation drain electrode 137c2 are formed adjacently at opposite sides of the second compensation channel 131c2, respectively. The second compensation drain electrode 137c2 is connected to the first data connecting member 174 through a contact hole 63.

Two initialization transistors T4 are formed to prevent the leakage current, and include a first initialization transistor T4-1 and a second initialization transistor T4-2 that are adjacent to each other. The first initialization transistor T4-1 is disposed based on the previous scan line 152, and the second initialization transistor T4-2 is disposed based on the protruding portion of the previous scan line 152. The first initialization transistor T4-1 includes a first initialization channel 131d1, a first initialization gate electrode 155d1, a first initialization source electrode 136d1, and a first initialization drain electrode 137d1, and the second initialization transistor T4-2 includes a second initialization channel 131d2, a second initialization gate electrode 155d2, a second initialization source electrode 136d2, and a second initialization drain electrode 137d2.

The first initialization gate electrode 155d1 that is a part of the previous scan line 152 overlaps the first initialization channel 131d1, and the first initialization source electrode 136d1 and the first initialization drain electrode 137d1 are formed adjacently at opposite sides of the first initialization channel 131d1, respectively. The first initialization source electrode 136d1 is connected to a second data connecting member 175 through a contact hole 64, and the first initialization drain electrode 137d1 is connected to the second initialization source electrode 136d2.

The second initialization gate electrode 155d2 that is a protruding portion of the previous scan line 152 protruded downward therefrom overlaps the second initialization channel 131d2, and the second initialization source electrode 136d2 and the second initialization drain electrode 137d2 are formed adjacently at opposite sides of the second initialization channel 131c2, respectively. The second initialization drain electrode 137d2 is connected to the first data connecting member 174 through the contact hole 63.

In this way, the compensation transistor T3 is formed to have the first compensation transistor T3-1 and the second compensation transistor T3-2, and the initialization transistor T4 is formed to have the first initialization transistor T4-1 and the second initialization transistor T4-2. Accordingly, an electron moving path of channels 131c1, 131c2, 131d1, and 131d2 can be blocked in the OFF state, so the leakage current can be effectively prevented.

The operation control transistor T5 includes the operation control channel 131e, an operation control gate electrode 155e, an operation control source electrode 136e, and an operation control drain electrode 137e. The operation control gate electrode 155e that is a part of the light emitting control line 153 overlaps the operation control channel 131e, and the operation control source electrode 136e and the operation control drain electrode 137e are formed adjacently at opposite sides of the operation control channel 131e, respectively. The operation control source electrode 136e is connected to a part of the driving voltage line 172 through a contact hole 65.

The light emission control transistor T6 includes the light emitting control channel 131f, a light emitting control gate electrode 155f, the light emitting control source electrode 136f, and a light emitting control drain electrode 137f. The light emitting control gate electrode 155f that is a part of the light emitting control line 153 overlaps the light emitting control channel 131f, and the light emitting control source electrode 136f and the light emitting control drain electrode 137f are formed adjacently at opposite sides of the light emitting control channel 131f, respectively. The light emitting control drain electrode 137f is connected to a third data connecting member 179 through a contact hole 66.

The bypass thin film transistor T7 includes the bypass channel 131g, a bypass gate electrode 155g, a bypass source electrode 136g, and a bypass drain electrode 137g. The bypass gate electrode 155g that is a part of the bypass control line 158 overlaps the bypass channel 131g, and the bypass source electrode 136g and the bypass drain electrode 137g are formed adjacently at opposite sides of the bypass channel 131g, respectively. The bypass source electrode 136g is connected to the third data connecting member 179 through a contact hole 81, and the bypass drain electrode 137g is connected directly to the first initialization source electrode 136d1.

The driving channel 131a of the driving transistor T1 is connected at a first end thereof to the switching drain electrode 137b and the operation control drain electrode 137e, and is connected at a second end thereof to the compensation source electrode 136c and the light emitting control source electrode 136f.

The storage capacitor $C_{st}$ includes a first storage electrode 155a and a second storage electrode 156 that are disposed with a second gate insulating layer 142 interposed therebetween. The first storage electrode 155a is the driving gate electrode 155a, and the second storage electrode 156 is an expanded part of a storage line 126 that occupies a larger area than the driving gate electrode 155a and covers the driving gate electrode 155a entirely. Herein, the second gate insulating layer 142 becomes a dielectric, and storage capacitance thereof is determined by electric charges accumulated in the storage capacitor $C_{st}$ and the voltage between two electrodes 155a and 156. In this way, by using the driving gate electrode 155a as the first storage electrode 155a, an available space for forming the storage capacitor can be secured in a space that is narrowed due to the driving channel 131a that occupies a large area in the pixel.

The first storage electrode 155a that serves as the driving gate electrode 155a is connected to a first end of the first data connecting member 174 through the contact hole 61 and a storage opening 68. The storage opening 68 is an opening that is positioned on the second storage electrode 156. The first data connecting member 174 is formed substantially in parallel on the same layer as that of the data line 171. A second end of the first data connecting member 174 is connected to the second compensation drain electrode 137c2 of the second compensation transistor T3-2 and the second initialization drain electrode 137d2 of the second initialization transistor T4-2 through the contact hole 63. Accordingly, the first data connecting member 174 connects the driving gate electrode 155a to the second compensation drain electrode 137c2 of the second compensation transistor T3-2, and to the second initialization drain electrode 137d2 of the second initialization transistor T4-2.

The second storage electrode 156 is connected to the driving voltage line 172 through a contact hole 69.

Accordingly, the storage capacitor $C_{st}$ stores the storage capacitance corresponding to the voltage difference between the driving voltage ELVDD that is transferred to the second storage electrode 156 through the driving voltage line 172, and the gate voltage $V_g$ of the driving gate electrode 155a.

The third data connecting member 179 is connected to the pixel electrode 191 through the contact hole 81, and the second data connecting member 175 is connected to the initialization voltage line 192 through a contact hole 82.

Such adjacent pixels of the OLED display according to the exemplary embodiment of the described technology can be configured to have a horizontally symmetric shape.

Hereinafter, the detailed cross-sectional configuration of the OLED display according to an exemplary embodiment of the described technology will be described according to a laminating sequence with reference to FIG. 9 and FIG. 10.

Herein, a stacked configuration of the operation control transistor T5 is substantially identical to that of the light emission control transistor T6, so detailed descriptions thereof will be omitted.

A buffer layer 120 is disposed on a substrate 110. The substrate 110 can be an insulating substrate that is formed of glass, quartz, ceramic, plastic, or the like, and the buffer layer 120 blocks an impurity from the substrate 110 during a crystallization process for forming the polycrystalline semiconductor, so the buffer layer 120 can improve a characteristic of the polycrystalline semiconductor and decrease stress of the substrate 110.

The semiconductor 130 that includes the driving channel 131a, the switching channel 131b, the compensation channel 131c, the initialization channel 131d, the operation control channel 131e, the light emitting control channel 131f, and the bypass channel 131g is disposed on the buffer layer 120. In the semiconductor 130, the driving source electrode 136a and the driving drain electrode 137a are disposed on opposite sides of the driving channel 131a, and the switching source electrode 136b and the switching drain electrode 137b are disposed on opposite sides of the switching channel 131b. Further, the first compensation source electrode 136c1 and the first compensation drain electrode 137c1 are disposed on opposite sides of the first compensation channel 131c1, the second compensation source electrode 136c2 and the second compensation drain electrode 137c2 are disposed on opposite sides of the second compensation channel 131c2, the first initialization source electrode 136d1 and the first initialization drain electrode 137d1 are disposed on opposite sides of the first initialization channel 131d1, and the second initialization source electrode 136d2 and the second initialization drain electrode 137d2 are disposed on opposite sides of the second initialization channel 131d2. The operation control source electrode 136e and the operation control drain electrode 137e are disposed on opposite sides of the operation control channel 131e, and the light emitting control source electrode 136f and the light emitting control drain electrode 137f are disposed on opposite sides of the light emitting control channel 131f. The bypass source electrode 136g and the bypass drain electrode 137g are disposed on opposite sides of the bypass channel 131g.

A first gate insulating layer 141 that covers the semiconductor 130 is formed on the semiconductor 130. First gate wires 151, 152, 153, 158, 155a, 155b, 155c1, 155c2, 155d1, 155d2, 155e, 155f, and 155g that include the scan line 151 including the switching gate electrode 155b, the first compensation gate electrode 155c1, and the second compensation gate electrode 155c2, the previous scan line 152 including the first initialization gate electrode 155d1 and the second initialization gate electrode 155d2, the light emitting control line 153 including the operation control gate electrode 155e and the light emitting control gate electrode 155f, the bypass control line 158 including the bypass gate electrode 155g, and the driving gate electrode 155a that is the first storage electrode are formed on the first gate insulating layer 141.

A second gate insulating layer 142 that covers the first gate wires 151, 152, 153, 158, 155a, 155b, 155c1, 155c2, 155d1, 155d2, 155e, 155f, and 155g, and the first gate insulating layer 141 is formed thereon. The first gate insulating layer 141 and the second gate insulating layer 142 can be formed of a silicon nitride (SiNx), a silicon oxide (SiOx), or the like.

An interlayer insulating layer 160 is disposed on the second gate insulating layer 142 and second gate wires 126 and 156. The interlayer insulating layer 160 can be formed of a silicon nitride (SiNx), a silicon oxide (SiOx), or the like.

Contact holes 61, 62, 63, 64, 65, 66, and 69 are formed on the interlayer insulating layer 160. Data wires 171, 172, 174, 175, and 179 that include the data line 171, the driving voltage line 172, the first data connecting member 174, the second data connecting member 175, and the third data connecting member 179 are disposed on the interlayer insulating layer 160.

The data line 171 is connected to the switching source electrode 136b through the contact hole 62 that is positioned in the first gate insulating layer 141, the second gate insulating layer 142, and the interlayer insulating layer 160, the first end of the first data connecting member 174 is connected to the first storage electrode 155a through the contact hole 61 that is positioned in the second gate insulating layer 142 and the interlayer insulating layer 160, and a second end of first data connecting member 174 is connected to the second compensation drain electrode 137c2 and the second initialization drain electrode 137d2 through the contact hole 63 that is positioned in the first gate insulating layer 141, the second gate insulating layer 142, and the interlayer insulating layer 160.

The second data connecting member 175 that is configured to have a square shape is connected to the first initialization source electrode 136d1 through the contact hole 64 that is positioned in the first gate insulating layer 141, the second gate insulating layer 142, and the interlayer insulating layer 160. Further, the third data connecting member 179 that is configured to have the square shape is connected to the light emitting control drain electrode 137f through the contact hole 66 that is positioned in the first gate insulating layer 141, the second gate insulating layer 142, and the interlayer insulating layer 160.

A passivation layer 180 that covers the data wires 171, 172, 174, 175, and 179 and the interlayer insulating layer 160 is disposed thereon. The passivation layer 180 can be formed of an organic layer.

The pixel electrode 191 and the initialization voltage line 192 are disposed on the passivation layer 180. The third data connecting member 179 is connected to the pixel electrode 191 through the contact hole 81 that is positioned in the passivation layer 180, and the second data connecting member 175 is connected to the initialization voltage line 192 through the contact hole 82 that is positioned in the passivation layer 180.

A pixel defined layer (PDL) 350 that covers edges of the passivation layer 180, the initialization voltage line 192, and the pixel electrode 191 is disposed thereon, and the pixel defined layer 350 is configured to have a pixel opening 351 that exposes the pixel electrode 191. The pixel defined layer 350 can be formed of a resin such as polyacrylates, polyimides, or the like, a silica-based inorganic material, or the like.

An organic emission layer 370 is formed on the pixel electrode 191 that is exposed by the pixel opening 351, and the common electrode 270 is disposed on the organic emission layer 370. The common electrode 270 is also disposed on the pixel defined layer 350, so the common electrode 270 is disposed across a plurality of pixels. In this way, the OLED that includes the pixel electrode 191, the organic emission layer 370, and the common electrode 270 is formed.

Herein, the pixel electrode 191 serves as the anode that is a hole injecting electrode, and the common electrode 270 serves as the cathode that is an electron injecting electrode. However, the exemplary embodiment of the described technology is not limited thereto, and the pixel electrode 191 can serve as the cathode and the common electrode 270 can serve as the anode depending on a driving method of the OLED display. Holes and electrons are injected respectively from the pixel electrode 191 and the common electrode 270 into the emission layer 370, and when excitons that are obtained by recombining injected holes and electrons fall from an excited state to a ground state, light is emitted.

The organic emission layer 370 is formed of a low molecular weight organic material or a high molecular weight organic material such as PEDOT (poly(3,4-ethylenedioxythiophene)), or the like. Further, the organic emission layer 370 can be formed of a multilayer that includes at least one of an emission layer, a hole injection layer (HIL), a hole transporting layer (HTL), an electron transporting layer (ETL), and an electron injection layer (EIL). In the case that all the layers are included, the hole injection layer is disposed on the pixel electrode 191 that serves as the anode, and the hole transporting layer, the emission layer, the electron transporting layer, and the electron injection layer are sequentially stacked thereon.

The organic emission layer 370 can include a red organic emission layer that emits red light, a green organic emission layer that emits green light, and a blue organic emission layer that emits blue light, and the red organic emission layer, the green organic emission layer, and the blue organic emission layer are respectively formed in a red pixel, a green pixel, and a blue pixel to implement a color image.

Further, the organic emission layer 370 can implement the color image by stacking all of the red organic emission layer, the green organic emission layer, and the blue organic emission layer together in each of the red pixel, the green pixel, and the blue pixel, and forming a red color filter, a green color filter, and a blue color filter for each pixel. As another example, the color image can be implemented by forming a white organic emission layer that emits white light in all of the red pixel, the green pixel, and the blue pixel, and forming the red color filter, the green color filter, and the blue color filter for each pixel. In the case that the color image is implemented by the white organic emission layer and the color filter, a deposition mask for depositing the red organic emission layer, the green organic emission layer, and the blue organic emission layer on each pixel, i.e., the red pixel, the green pixel, and the blue pixel is not required.

The white organic emission layer that is described in another example can be formed of one organic emission layer, and include a plurality of organic emission layers that are stacked to emit white light. For example, at least one yellow organic emission layer and at least one blue organic emission layer are combined to emit white light, at least one cyan organic emission layer and at least one red organic emission layer are combined to emit white light, at least one magenta organic emission layer and at least one green organic emission layer are combined to emit white light, and the like can be included.

A sealing member (not shown) that protects the OLED can be disposed on the common electrode 270, can be sealed by a sealant to the substrate 110, and can be formed of various materials such as glass, quarts, ceramic, plastic, metal, and the like. Meanwhile, a thin film sealing layer can be disposed on the common electrode 270 by depositing the organic layer and an inorganic layer without using the sealant.

The above-described inventive technology is not limited to the disclosed embodiments and the annexed drawings, and it is obvious to those skilled in the art that various modifications, substitutions, and changes can be made without departing from the spirit and scope of the present invention.

What is claimed is:

1. An organic light-emitting diode (OLED) display comprising:
    a plurality of light emitting pixels disposed in a display region and including a first light emitting pixel, a second light emitting pixel, a third light emitting pixel and a fourth light emitting pixel;
    a plurality of dummy pixels disposed in a dummy region and including a first dummy pixel and a second dummy pixel;
    a plurality of repair lines including i) a first repair line connecting the first dummy pixel and the third and fourth light emitting pixels and ii) a second repair line connecting the second dummy pixel and the first and second light emitting pixels; and
    a connection line connecting the first and second repair lines, wherein the first and second dummy pixels have semiconductors that have symmetrical shapes with respect to a virtual line,
    wherein a semiconductor of the first light emitting pixel and the semiconductor of the first dummy pixel have shapes that are the same, and
    wherein a semiconductor of the second light emitting pixel and the semiconductor of the second dummy pixel have shapes that are the same.

2. The OLED display of claim 1, wherein the semiconductor of the first light emitting pixel and the semiconductor of the second light emitting pixels have symmetrical shapes about a virtual line.

3. The OLED display of claim 2, wherein each of the light emitting pixels comprises an OLED and a light emitting pixel circuit connected to the OLED, and each of the dummy pixel comprises a dummy pixel circuit.

4. The OLED display of claim 3, wherein the semiconductor of the first light emitting pixel has a Z shape.

5. The OLED display of claim 3, wherein the light emitting pixel circuit comprises i) a switching transistor connected to a scan line configured to provide a scan signal and a data line configured to provide a data voltage and crossing the scan line and ii) a driving transistor connected to the switching transistor.

6. The OLED display of claim 5, wherein the dummy pixel circuit comprises i) a switching transistor connected to the scan line and a dummy data line and ii) a driving transistor connected to the switching transistor.

7. The OLED display of claim 3, wherein the dummy pixel does not have an OLED.

8. The OLED display of claim 5, wherein the OLED comprises a pixel electrode electrically connected to the driving transistor of the light emitting pixel circuit, an organic light emitting layer disposed on the pixel electrode, and a common electrode disposed on the organic light emitting layer.

9. The OLED display of claim 1, wherein the dummy region is disposed on at least one of left and right sides of the display region.

10. The OLED display of claim 9, wherein the first and second dummy pixels are alternately formed in each row.

11. The OLED display of claim 10, wherein the first and second light emitting pixels are alternately formed in each column.

12. The OLED display of claim 1, wherein the dummy region is disposed on at least one of upper and lower sides of the display region.

13. The OLED display of claim 12, wherein the first and second dummy pixels are alternately formed in each column.

14. The OLED display of claim 13, wherein the first and second light emitting pixels are alternately formed in each column.

15. An organic light-emitting diode (OLED) display comprising:
- a plurality of light emitting pixels disposed in a display region and including a first light emitting pixel and a second light emitting pixel, wherein semiconductors of the first and second light emitting pixels have symmetrical shapes with respect to a virtual line therebetween, and wherein each of the light emitting pixels includes an OLED;
- a plurality of dummy pixels disposed in a dummy region and including a first dummy pixel and a second dummy pixel, wherein the first and second dummy pixels are symmetrical with respect to a virtual line therebetween;
- a plurality of dummy pixels disposed in a dummy region and including a first dummy pixel and a second dummy pixel, wherein semiconductors of the first and second dummy pixels have symmetrical shapes with respect to a virtual line;
- wherein the first dummy pixel is configured to drive the OLED of the first light emitting pixel when the first light emitting pixel becomes defective, and wherein the second dummy pixel is configured to drive the OLED of the second light emitting pixel when the second light emitting pixel becomes defective,
- wherein the semiconductor of the first light emitting pixel and the semiconductor of the first dummy pixel have shapes that are the same, and
- wherein the semiconductor of the second light emitting pixel and the semiconductor of the second dummy pixel have shapes that are the same.

16. The OLED display of claim 15, further comprising:
- a third light emitting pixel and a fourth light emitting pixel disposed in the display region;
- a plurality of repair lines including i) a first repair line connecting the first dummy pixel and the third and fourth light emitting pixels and ii) a second repair line connecting the second dummy pixel and the first and second light emitting pixels; and
- a connection line connecting the first and second repair lines,
- wherein semiconductors of the third and fourth light emitting pixels have symmetrical shapes with respect to a virtual line therebetween,
- wherein the semiconductor of the third light emitting pixel and the semiconductor of the first dummy pixel have shapes that are the same, and
- wherein the semiconductor of the fourth light emitting pixel and the semiconductor of the second dummy pixel have shapes that are the same.

17. The OLED display of claim 16, wherein the first and second dummy pixels are located in two adjacent rows and configured to drive the OLED of any defective light emitting pixel in the two adjacent rows via the connection line.

18. The OLED display of claim 17, further comprising:
- a dummy data driver configured to drive the dummy pixels;
- a data driver configured to drive the light emitting pixels and transmit a data signal to the dummy data driver;
- a controller controlling the dummy data driver and the data driver.

19. An organic light-emitting diode (OLED) display comprising:
- a display panel including a display region and a dummy region that do not overlap each other, wherein the display panel comprises:
- a plurality of light emitting pixels disposed in the display region and including a first light emitting pixel, and a second light emitting pixel, a third light emitting pixel and a fourth light emitting pixel;
- a plurality of dummy pixels disposed in the dummy region and including a first dummy pixel and a second dummy pixel;
- a plurality of repair lines including i) a first repair line connecting the first dummy pixel and the third and fourth light emitting pixels and ii) a second repair line connecting the second dummy pixel and the first and second light emitting pixels;
- a connection line connecting the first and second repair lines, wherein semiconductors of the first and second dummy pixels are symmetrical with respect to a virtual line therebetween;
- a dummy data driver configured to drive the dummy pixels;
- a data driver configured to drive the light emitting pixels and transmit a data signal to the dummy data driver; and
- a controller controlling the dummy data driver and the data driver,
- wherein a semiconductor of the first light emitting pixel and the semiconductor of the first dummy pixel have shapes that are the same, and
- wherein a semiconductor of the second light emitting pixel and the semiconductor of the second dummy pixel have shapes that are the same.

20. The OLED display of claim 19, wherein each of the light emitting pixels includes an OLED, and wherein the first and second dummy pixels are located in two adjacent rows and configured to drive the OLED of any defective light emitting pixel in the two adjacent rows via the connection line.

* * * * *